(12) United States Patent
Liou et al.

(10) Patent No.: US 9,875,937 B2
(45) Date of Patent: Jan. 23, 2018

(54) METHOD FOR FORMING SEMICONDUCTOR STRUCTURE WITH NANOWIRE STRUCTURES

(71) Applicant: UNITED MICROELECTRONICS CORP., Hsin-Chu (TW)

(72) Inventors: En-Chiuan Liou, Tainan (TW); Yu-Cheng Tung, Kaohsiung (TW); Chih-Wei Yang, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/356,671

(22) Filed: Nov. 21, 2016

(65) Prior Publication Data
US 2017/0069540 A1 Mar. 9, 2017

Related U.S. Application Data

(62) Division of application No. 14/663,464, filed on Mar. 20, 2015, now abandoned.

(30) Foreign Application Priority Data

Feb. 6, 2015 (CN) .......................... 2015 1 0063099

(51) Int. Cl.
| | |
|---|---|
| *H01L 21/8234* | (2006.01) |
| *H01L 21/02* | (2006.01) |
| *H01L 21/322* | (2006.01) |
| *H01L 29/10* | (2006.01) |
| *H01L 29/08* | (2006.01) |

(Continued)

(52) U.S. Cl.
CPC .............. *H01L 21/823431* (2013.01); *H01L 21/02532* (2013.01); *H01L 21/02603* (2013.01); *H01L 21/02667* (2013.01); *H01L 21/324* (2013.01); *H01L 21/823412* (2013.01); *H01L 27/0886* (2013.01); *H01L 29/0673* (2013.01); *H01L 29/1033* (2013.01); *H01L 29/42392* (2013.01); *H01L 29/78696* (2013.01);

(Continued)

(58) Field of Classification Search
None
See application file for complete search history.

(56) References Cited

U.S. PATENT DOCUMENTS

| | | | |
|---|---|---|---|
| 6,897,098 B2 | 5/2005 | Hareland | |
| 7,727,830 B2 * | 6/2010 | Jin | ........................ B82Y 10/00 257/331 |

(Continued)

*Primary Examiner* — Robert Carpenter
(74) *Attorney, Agent, or Firm* — Winston Hsu

(57) ABSTRACT

The present invention provides a method for forming a semiconductor structure. Firstly, a substrate is provided, the substrate comprises an insulating layer and at least one first nano channel structure disposed thereon, a first region and a second region being defined on the substrate, next, a hard mask is formed within the first region, afterwards, an etching process is performed, to remove parts of the insulating layer within the second region, an epitaxial process is then performed, to form an epitaxial layer on the first nano channel structure, and an anneal process is performed, to transform the first nano channel structure and the epitaxial layer into a first nanowire structure, wherein the diameter of the first nanowire structure within the first region is different from the diameter of the first nanowire structure within the second region.

8 Claims, 6 Drawing Sheets

(51) Int. Cl.
*H01L 29/06* (2006.01)
*H01L 27/088* (2006.01)
*H01L 21/324* (2006.01)
*H01L 29/423* (2006.01)
*H01L 29/786* (2006.01)
*B82Y 10/00* (2011.01)
*B82Y 40/00* (2011.01)
*H01L 29/66* (2006.01)
*H01L 29/775* (2006.01)

(52) U.S. Cl.
CPC ............... *B82Y 10/00* (2013.01); *B82Y 40/00* (2013.01); *H01L 29/66439* (2013.01); *H01L 29/775* (2013.01)

(56) References Cited

U.S. PATENT DOCUMENTS

| | | |
|---|---|---|
| 7,838,368 B2 | 11/2010 | Surdeanu |
| 8,110,458 B2 | 2/2012 | Jin |
| 8,420,455 B2 | 4/2013 | Bangsaruntip |
| 2014/0210013 A1 | 7/2014 | Kim |

* cited by examiner

METHOD FOR FORMING SEMICONDUCTOR STRUCTURE WITH NANOWIRE STRUCTURES

CROSS REFERENCE TO RELATED APPLICATIONS

This application is a divisional application of U.S. patent application Ser. No. 14/663,464 filed Mar. 20, 2015, which is herein incorporated by reference in its entirety.

BACKGROUND OF THE INVENTION

1. Field of the Invention

The present invention relates to a nanowire structure, and in particular, to a nanowire structure which has different diameters within its gate region and within its source/drain (S/D) region.

2. Description of the Prior Art

The fabrication of a nanowire field effect transistor (FET) with a gate dielectric and a gate conductor surrounding the nanowire channel (also known as a gate-all-around nanowire FET) includes suspension of the nanowires. Suspension of the nanowires allows for the gate conductor to cover all surfaces of the nanowires.

The fabrication of a gate-all-around nanowire FET typically includes the following steps: (1) Definition of the nanowires between source and drain regions by patterning a silicon-on-insulator (SOI) layer. (2) Suspension of the nanowires by isotropic etching that undercuts the insulator on which the nanowires are resting. This etching step also undercuts the insulator at the edge of the source and drain region. (3) A blanket and conformal deposition of the gate dielectric and the gate conductor. The gate dielectric and the gate conductor wraps around the suspended nanowires and fills the undercut at the edge of the source and drain regions. (4) Definition of the gate line which includes the etching of the gate line and removal of the gate dielectric and the gate conductor material from all regions outside the gate line, including gate material deposited in the cavities at the edge of the source and drain regions.

SUMMARY OF THE INVENTION

The present invention provides a semiconductor structure, comprising a substrate, a first nanowire structure disposed on the substrate, and the first nanowire structure includes a gate region and a source/drain region, wherein the diameter of the first nanowire structure within the gate region is different from the diameter of the first nanowire structure within the source/drain region.

The present invention further provides a method for forming a semiconductor structure, comprising: first, a substrate is provided, the substrate comprises an insulating layer and at least one first nano channel structure disposed thereon, a first region and a second region are defined on the substrate, next, a hard mask is formed within the first region, to cover the first nano channel structure and the insulating layer, afterwards, an etching process is performed, to remove parts of the insulating layer within the second region, an epitaxial process is performed, to form an epitaxial layer on the first nano channel structure, wherein the thickness of the epitaxial layer within the first region is different from the thickness of the epitaxial layer within the second region, and an anneal process is performed, to transform the first nano channel structure and the epitaxial layer into a first nanowire structure, wherein the diameter of the first nanowire structure within the first region is different from the diameter of the first nanowire structure within the second region.

In summary, the present invention provides methods for forming the nanowire structure, and the nanowire structure have different diameters within its gate region and within its S/D region, or in another case, to form different nanowire structures with different diameters. Since the diameter of the nanowire structure will influence the threshold voltage (Vt) of a nanowire filed effect transistor (FET) structure, by using the methods mentioned above, a nanowire structure that has different diameters within different regions (within the gate region and within the S/D region) can be formed, so as to increase the flexibility of the nanowire FET applications.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
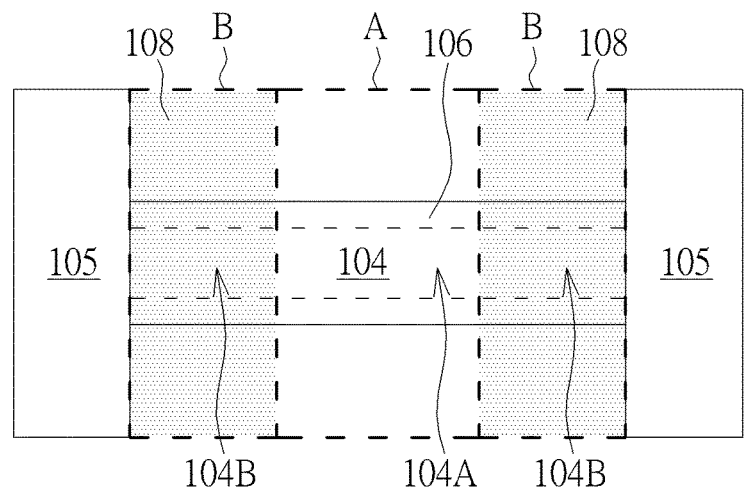
FIG. 1 is a top-view diagram of the nanowire structure.
Figure 1A:
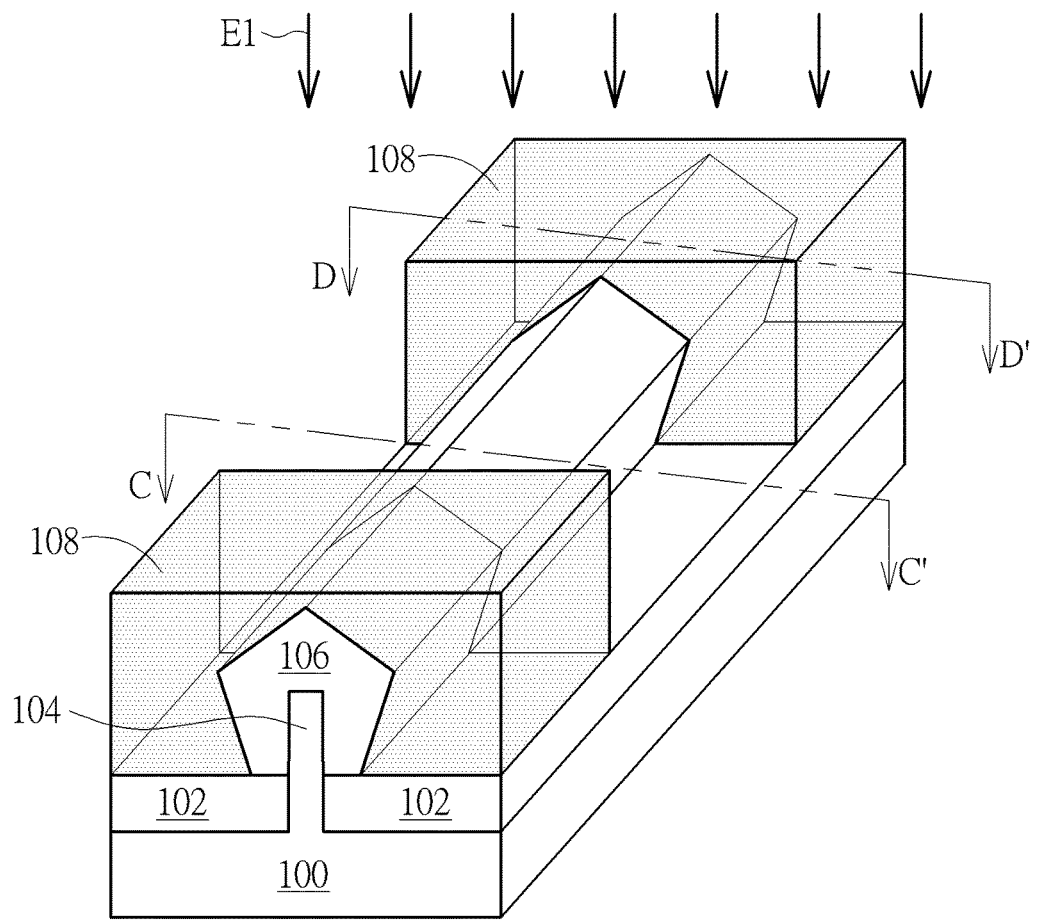
FIG. 1A is a 3D diagram of the nanowire structure of the first preferred embodiment.
Figure 2A:
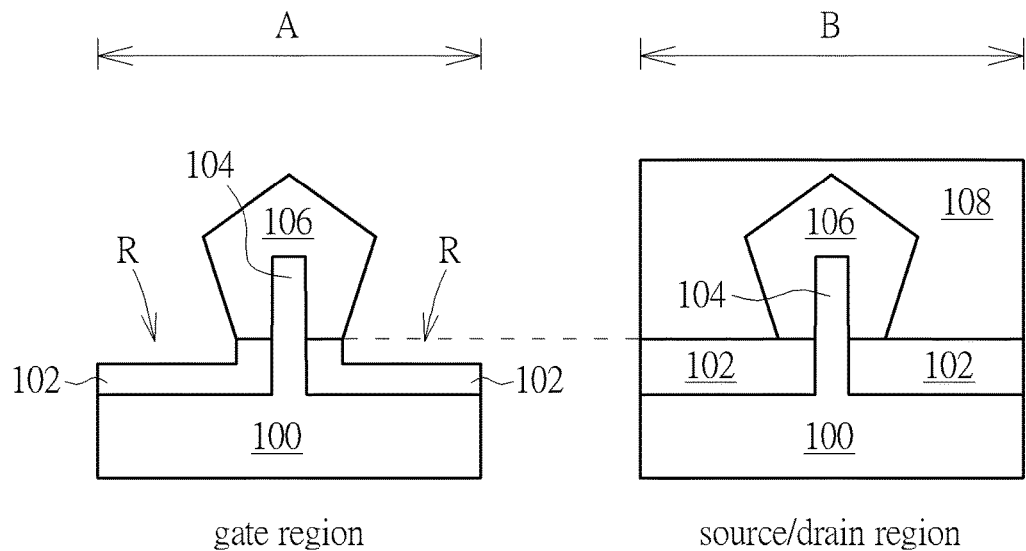
FIGS. 2A-2B show the cross section diagrams of the gate region and of the S/D region respectively.
Figure 2B:
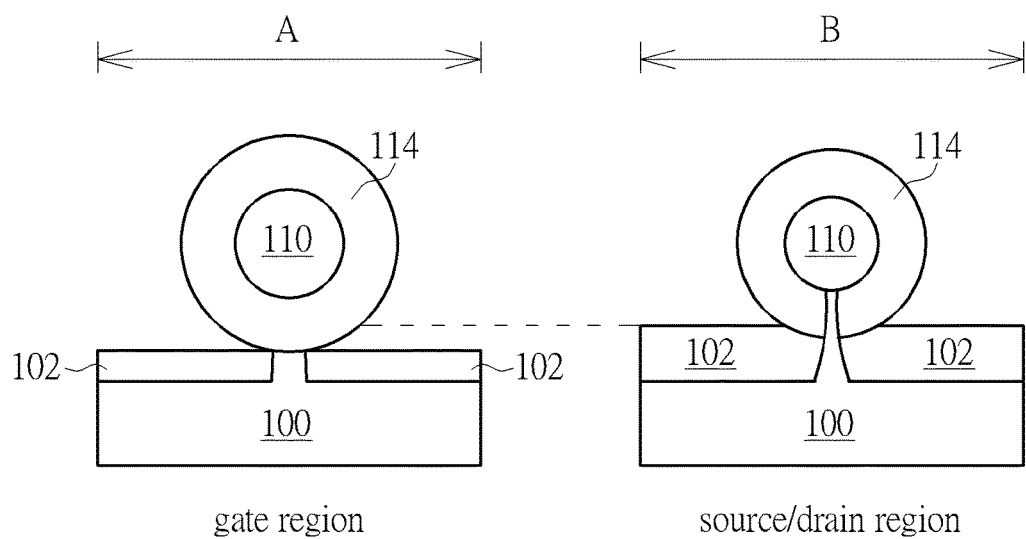

Please refer to FIG. 1, FIG. 1A, FIG. 2A-2B, which show the nanowire structure according to the first preferred embodiment of the present invention. FIG. 1 is a top-view diagram of the nanowire structure, FIG. 1A is a 3D diagram of the nanowire structure, and FIGS. 2A-2B show the cross section diagrams of the gate region and of the S/D region respectively. FIG. 2A includes two cross section structures, the left side structure is the cross section diagram along the cross section line C-C' of FIG. 1A, and the right side structure is the cross section diagram along the cross section line D-D' of FIG. 1A.

As shown in FIG. 1 and FIG. 1A, a substrate 100 is provided, the substrate 100 may include a semiconductor substrate such as a silicon substrate or a silicon-on-insulator (SOI) substrate. In this embodiment, the substrate 100 is a silicon substrate, but is not limited thereto. The substrate 100 comprises an insulating layer 102 and at least one first channel structure 104. In this embodiment, the insulating layer 102 such as a shallow trench isolation (STI), is preferably made of silicon oxide; and the material of the first channel structure 104 is same as the material of the substrate 100, such as silicon. In addition, in this embodiment, the first channel structure 104 and the substrate 100 are connected to each other. The first channel structure 104 such as a stripe-shaped structure or a fin shaped structure, but not limited thereto, and the first channel structure 104 will be transformed into a nanowire structure through an anneal process in the following processes, the gate and the source/drain (S/D) will also be formed and crossing over the nanowire structure. The manufacturing processes will be described more detail in the following paragraphs. Besides, if the substrate is an SOI substrate, the first channel structure 104 is preferably disposed on an insulating layer (not shown), and does not connect to the substrate. Furthermore, at least two supporting structure 105 may be disposed on two ends of the first channel structure 104, the material of the supporting structure 105 is same as the material of the first channel structure 104. To simplify the description, the supporting structure 105 is omitted and not shown in FIG. 1A.

Afterwards, an epitaxial layer 106 is then formed, to cover the first channel structure 104, wherein the epitaxial layer 106 may comprise silicon, silicon-germanium (SiGe), silicon phosphorus, silicon carbide or the combination thereof. Preferably, the epitaxial layer 106 is a silicon-germanium layer, which can be formed through a selective epitaxial process, due to the growth rate of the epitaxial layer being faster when growing along the specific crystal plane, so as shown in FIG. 1A or in FIG. 2A, the epitaxial layer 106 may have a polygonal cross section.

Next, please still refer to FIG. 1, FIG. 1A and FIG. 2A, in this embodiment, the substrate 100 comprises a first region A and a second region B defined thereon, a gate region 104A of the first channel structure 104 is disposed within the first region A, and at least one S/D region 104B of the first channel structure 104 is disposed within the second region B. In other words, the first channel structure 104 includes the gate region 104A and at least one S/D region 104B, disposed within the first region A and within the second region B respectively. In this embodiment, a hard mask 108 is formed within the second region B, such as a photoresist layer, to cover the S/D region 104B, and so as to expose the gate region 104A within the first region A. An etching process E1 is then performed, to etch the insulating layer 102 which is disposed within the first region A and disposed on the two sides of the first channel structure 104. As shown in FIG. 2A, within the first region A, the insulating layer 102 which is not covered by the epitaxial layer 106 will be removed, so as to form two recesses R on two sides of the first channel structure 104 respectively. The first etching process E1 mentioned above such as a dry-etching process and/or a wet-etching process, in this embodiment, uses the dilute HF (DHF) to carry out the wet-etching process, but not limited thereto. Afterwards, the hard mask 108 is then removed, and a cleaning process can be selectively performed.

Next, as shown in FIG. 2B, an anneal process is performed on the epitaxial layer 106 and the first channel structure 104, the temperature of the anneal process is about between 600-1100° C., and it can be carried out within an oxidation process. For example, if the epitaxial layer 106 is a silicon germanium layer, after the anneal process is performed, the epitaxial layer 106 and the first channel structure 104 will be transformed into a first nanowire structure 110, wherein the first nanowire structure 110 mainly consists of germanium, and an oxide layer 114 covers the outer surface of the first nanowire structure 110. It is noteworthy that after the anneal process, the silicon atoms of the epitaxial layer 106 will contact the air and combining with the oxygen atoms, so as to form the oxide layer 114. Therefore the rest of the germanium atoms will gather toward the center of the first nanowire structure 110. In this way, the germanium containing ratio in the center portion of the first nanowire structure 110 is higher than the germanium containing ratio in oxide layer 114, and the first nanowire structure 110 preferably has a circular cross section when viewed in a cross section view.

It is noteworthy that as shown in FIG. 2B, during the anneal process, parts of the first channel structure 104 will be transformed into the first nanowire structure 110 directly. In other words, the silicon atoms in the first channel structure 104 will be partially consumed. More precisely, in this embodiment, within the first region A, two recesses R are disposed on two sides of the first channel structure 104 respectively. Therefore, the first channel structure 104 within the first region A has larger surface area that contacts surrounding atmosphere than the surface area within the second region B (please also refer to FIG. 2A). In this way, after the anneal process is performed, the first nanowire structure 110 within the first region A has larger diameter than the first nanowire structure 110 within the second region B.

Figure 3:
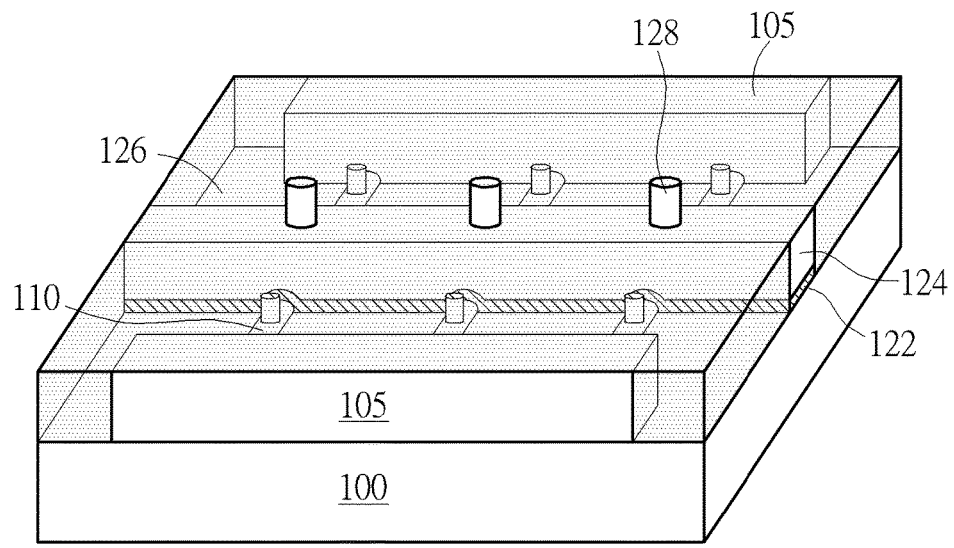
FIG. 3 is the schematic diagram showing the nanowire FET structure having a plurality of nanowire structures.

Even though FIG. 1, FIG. 1A and FIGS. 2A-2B only show one nanowire structure as an example, the present invention is not limited thereto. In another embodiment, the substrate 100 may comprise a plurality of first nanowire structures 110 disposed thereon, and this should be included in the scope of the present invention. Please refer to FIG. 3. FIG. 3 is the schematic diagram showing the nanowire FET structure having a plurality of nanowire structures. After the anneal process mentioned above, the oxide layer 114 that surrounds the first nanowire structure 110 is removed through an etching process, and the first nanowire structure 110 is therefore supported by the supporting structure 105 that is disposed on two ends of the substrate 100. Or in another embodiment, the first nanowire structure 110 can be supported by the remaining first channel structure 104. Next, a gate dielectric layer 122 and the gate layer 124 are formed sequentially, to cross over the first nanowire structure 110, and a dielectric layer 126 is entirely covered on the substrate 100 and on the first nanowire structure 110. A planarization process is then performed to remove the extra dielectric layer 126, and a plurality of contact plugs 128 are formed within the gate region 104A and within the S/D region 104B (please also refer to FIG. 1), to electrically connect the first nanowire structure 110, and complete the nanowire FET structure. The manufacturing processes mentioned above are well known to those skilled in the art, and will not be described redundantly. Besides, the following paragraphs will show some nanowire structures according to other embodiments of the present invention, and they can be applied in the process mentioned here too.

Since the diameter of the nanowire structure, including the center part of the nanowire structure or the thickness of the oxide layer, will influence the threshold voltage (Vt) of a nanowire FET structure, by using the method mentioned above, a nanowire structure that has different diameters within different regions (within the gate region and within the S/D region) can be formed. And a nanowire FET structure based on the nanowire structure mentioned above will have different Vt values within the gate region and within the S/D region.

Figure 4:
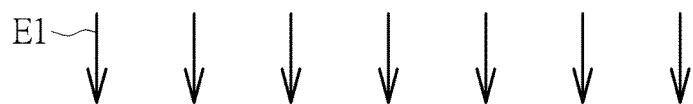
FIG. 4 is a 3D diagram of the nanowire structure of the second preferred embodiment.
Figure 4:
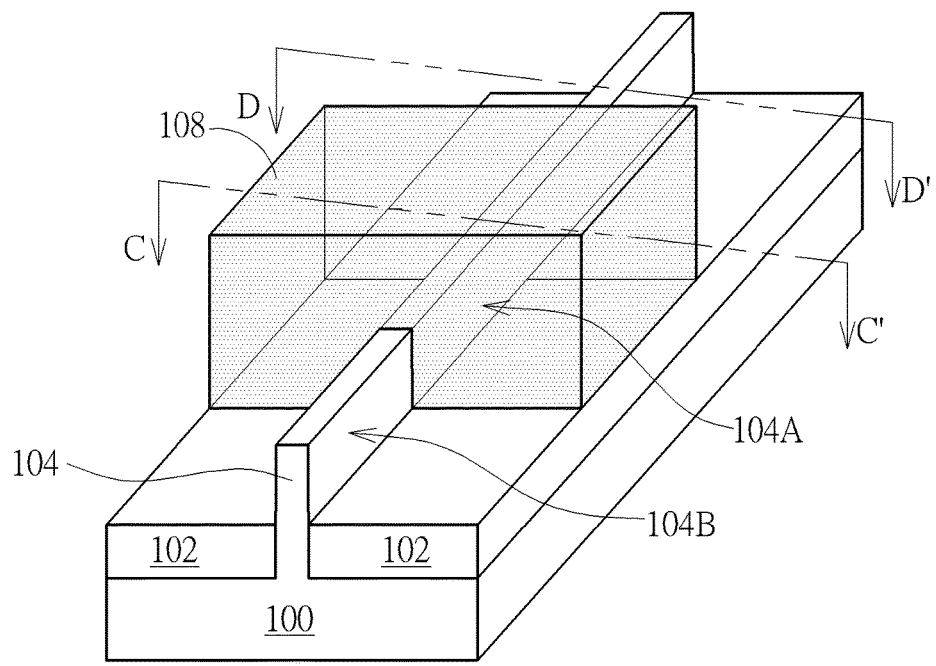
Figure 5A:
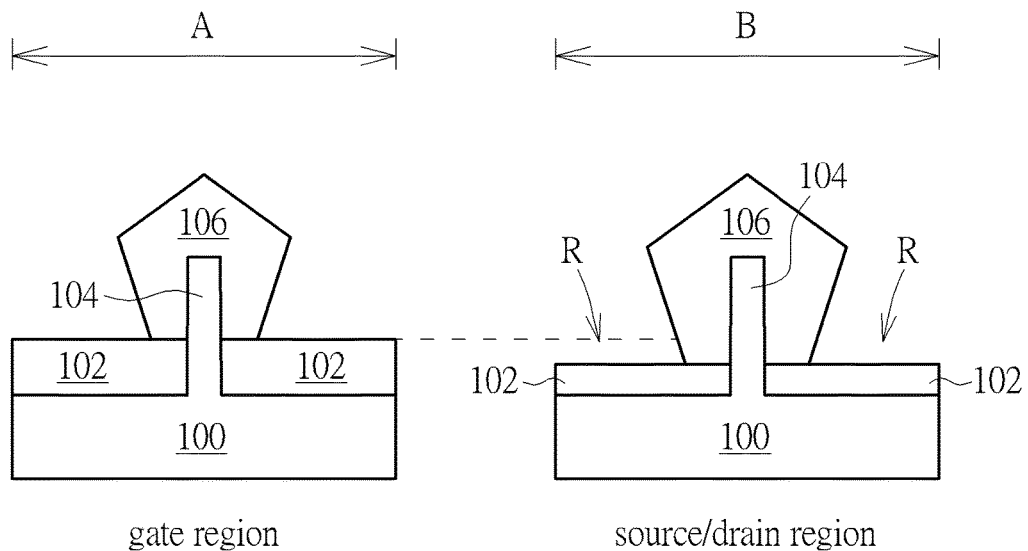
FIGS. 5A-5B show the cross section diagrams of the gate region and of the S/D region respectively.
Figure 5B:
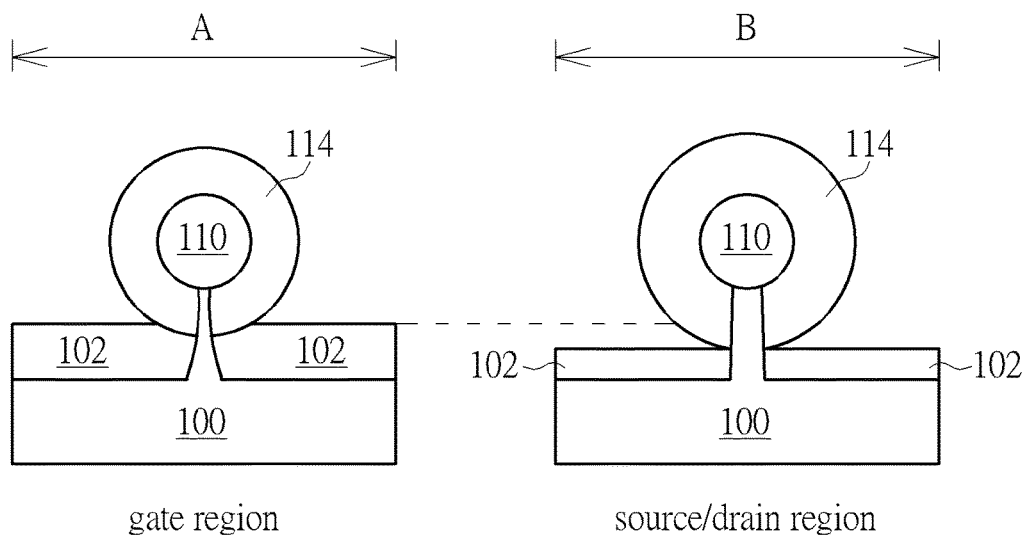

Please refer to FIG. 4, FIG. 5A-5B, which show the nanowire structure according to the second preferred embodiment of the present invention. FIG. 4 is a 3D diagram of the nanowire structure, and FIGS. 5A-5B show the cross section diagrams of the gate region and of the S/D region respectively. To simplify the description, the following description will detail the dissimilarities among the different embodiments and the identical features will not be redundantly described. In order to compare the differences between the embodiments easily, the identical components in each of the following embodiments are marked with identical symbols.

Please refer to FIG. 4 and FIG. 5A, similar to the first preferred embodiment mentioned above. The semiconductor structure includes a substrate 100, an insulating layer 102 and a first channel structure 104. Those elements are same as the elements in the first preferred embodiment. The difference with the first preferred embodiment is that the hard mask 108 covers within the first region A (please also refer to the first region A and the second region B shown in the first preferred embodiment) in this embodiment, especially covers the gate region 104A of the first channel structure 104, and exposes the S/D region 104B. In other words, the hard mask 108 directly covers the center portion of the fin structure, and an etching process E1 is then performed, so as to remove parts of the insulating layer 102 within the second region B, and to form two recesses R on two sides of the first channel structure 104. Afterwards, the hard mask 108 is then removed, and a cleaning process can be selectively carried out. Next, an epitaxial layer 106 is then formed on the first channel structure 104, since the recesses R are already formed within the second region B, so parts of the epitaxial layer 106 are formed in the recess R, and therefore the thickness of the epitaxial layer 106 within the second region B is thicker than the thickness of the epitaxial layer 106 within the first region A.

As shown in FIG. 5B, an anneal process is performed, to transform the epitaxial layer 106 and the first channel structure 104 into the first nanowire structure 110. Since the epitaxial layer 106 within the second region B is thicker than the epitaxial layer 106 within the first region A, after the anneal process is performed, the nanowire structure 110 within the second region B has larger diameter than the nanowire structure 110 within the first region A.

Similarly, by using the method mentioned above, a nanowire structure that has different diameters within different regions (within the gate region and within the S/D region) can be formed. Furthermore, a nanowire FET structure based on the nanowire structure mentioned above will have different Vt values within the gate region and within the S/D region.

In addition, in the first preferred embodiment, the epitaxial layer 106 is formed before the recess R is formed, but in the second preferred embodiment, the epitaxial layer 106 is formed after the recess R is formed, and both flows should be within the scope of the present invention.

Figure 6:
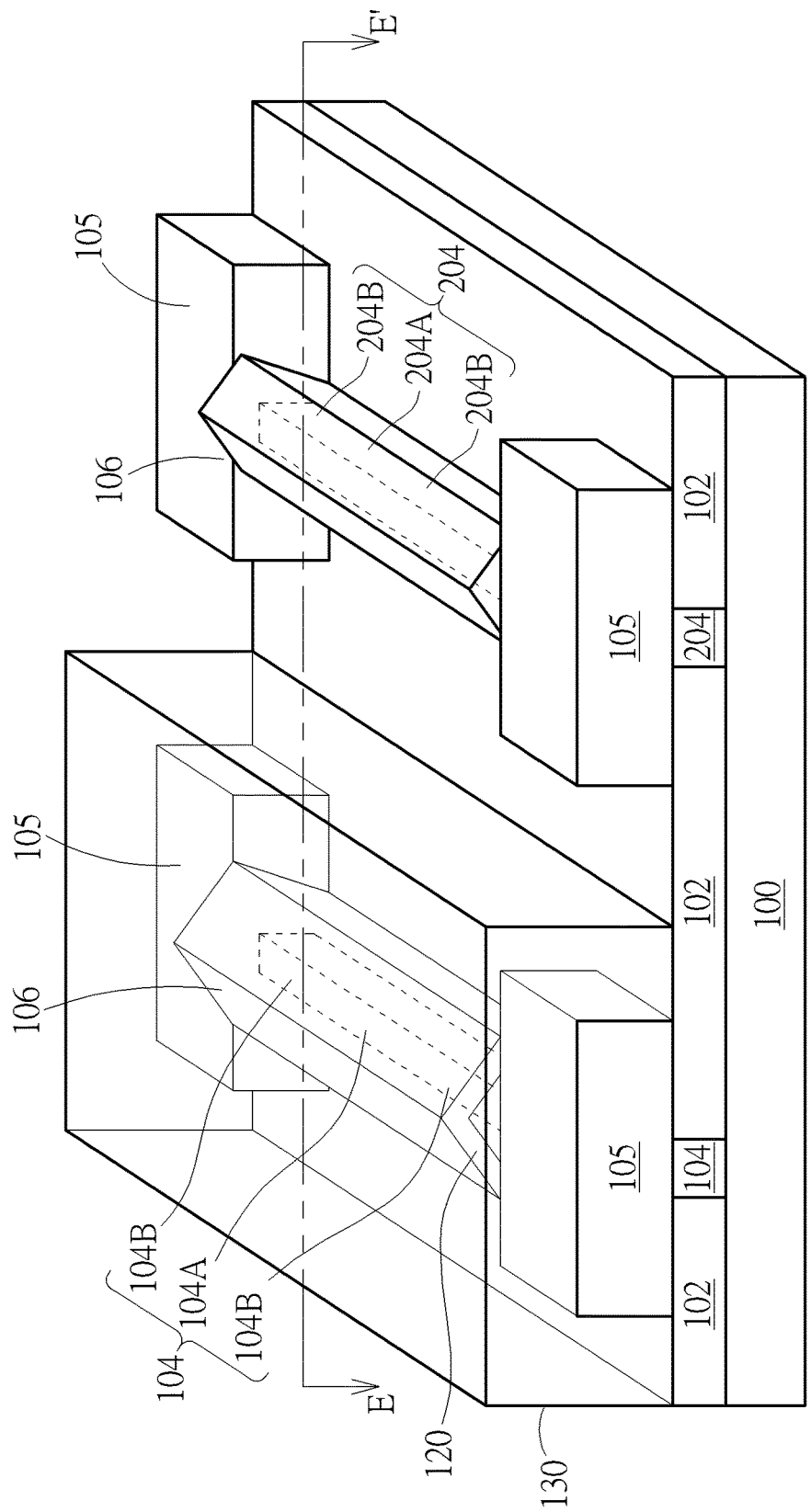
FIG. 6 is the schematic diagram showing a plurality of nanowire structures according to the third preferred embodiment of the present invention.
Figure 7:
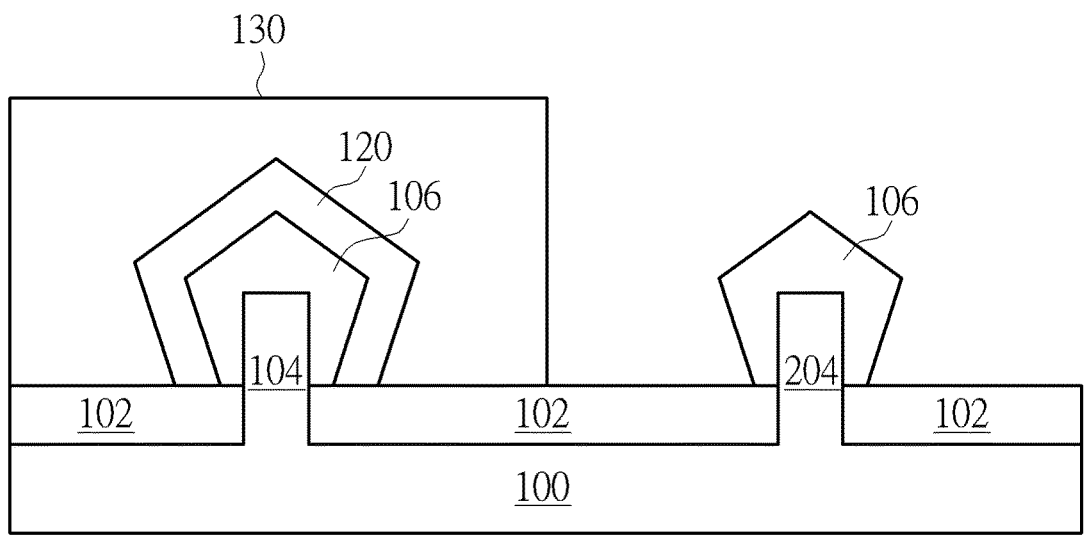
FIGS. 7-8 are cross section diagrams along the cross section line E-E' of FIG. 6.
Figure 8:
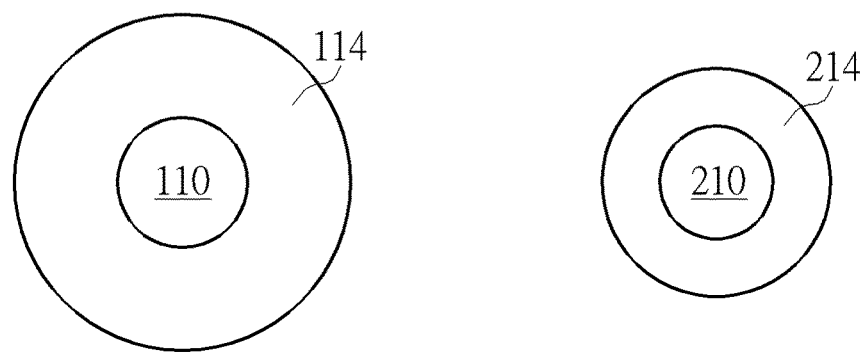

In addition, if there is more than one channel structure disposed on the substrate, another embodiment of the present invention provides a method for forming different nanowire structures with different diameters, and it will be detail described in the following paragraphs:

FIG. 6 is the schematic diagram showing a plurality of nanowire structures according to the third preferred embodiment of the present invention. FIGS. 7-8 are cross section diagrams along the cross section line E-E' of FIG. 6. As shown in FIG. 6, except for the first channel structure 104, at least one second channel structure 204 is further disposed on the substrate 100, wherein the material properties of the second channel structure 204 are mostly the same as the material properties of the first channel structure 104, but the width or the height of the second channel structure 204 may be the same as or different from the width or the height of the first channel structure 104. The first nanowire structure 110 includes the gate region 104A and the S/D region 104B, and the second nanowire structure 210 also includes a gate region 204A and at least one S/D region 204B, the supporting structures 105 being disposed on two ends of the first channel structure 104 and the second channel structure 204. An epitaxial layer 106 covers the first channel structure 104 and on the second channel structure 204. To simplify the description, the insulating layer is omitted in this embodiment, and not shown in figures. Next, a deposition process is performed, so as to form a material layer 120 on the epitaxial layer 106 which is disposed on the first channel structure 104 and on the second channel structure 204, and the material layer 120 may include an oxide layer or an epitaxial layer. As shown in FIGS. 6-7, a hard mask 130 is formed to cover the first channel structure 104, and an etching process is performed, to remove the material layer 120 on the second channel structure 204, and the hard mask 130 is then removed. Afterwards, an anneal process is performed.

Since the first channel structure 104 further comprises the material layer 120 disposed thereon before the anneal process is performed, after the anneal process, as shown in FIG. 8, the first channel structure 104 is transformed into the first nanowire structure 110 and the oxide layer 114, the second channel structure 204 is transformed into the second nanowire structure 210 and the oxide layer 214, and the diameter of the first nanowire structure 110 is larger than the second nanowire structure 210.

The third preferred embodiment can be combined with the first or the second preferred embodiments mentioned above. Therefore, except for that the first nanowire structure 110 and the second nanowire structure 210 have different diameters, each one nanowire structure have different diameters within the gate region and within the S/D region. For example, the gate region 104A of the first nanowire structure 110 may have larger diameter than the gate region 204A of the second nanowire structure 210; and the S/D region 104B of the first nanowire structure 110 may have larger diameter than the S/D region 204B of the second nanowire structure 210.

In the third embodiment mentioned above, the etching process is performed after the material layer 120 is formed on the first channel structure 104 and on the second channel structure 204, so as to remove the material layer 120 which is disposed on the second channel structure 204, but in another embodiment of the present invention, a hard mask can be formed to cover the second channel structure 204, and the material layer 120 is then formed only on the first channel structure 104 through a deposition process, and this should also be within the scope of the present invention.

In summary, the present invention provides some methods for forming the nanowire structure, and the nanowire structure have different diameters within its gate region and within its S/D region, or in another case, to form different nanowire structures with different diameters. Since the diameter of the nanowire structure will influence the threshold voltage (Vt) of a nanowire FET structure, by using the method mentioned above, a nanowire structure that has different diameters within different regions (within the gate region and within the S/D region) can be formed, so as to increase the flexibility of the nanowire FET applications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor structure, comprising:

providing a substrate, the substrate comprising an insulating layer and at least one first nano channel structure disposed thereon, a first region and a second region being defined on the substrate;

forming a hard mask within the first region, to cover the first nano channel structure and the insulating layer;

performing an etching process, to remove parts of the insulating layer within the second region, wherein the insulating layer within the first region is not removed during the etching process;

performing an epitaxial process after parts of the insulating layer within the second region are removed, to form an epitaxial layer on the first nano channel structure, wherein the thickness of the epitaxial layer within the first region is different from the thickness of the epitaxial layer within the second region; and performing an anneal process, to transform the first nano channel structure and the epitaxial layer into a first nanowire structure, wherein the diameter of the first nanowire structure within the first region is different from the diameter of the first nanowire structure within the second region.

2. The method of claim 1, wherein a gate region of the first nanowire structure is disposed within the first region, and a source/drain (S/D) region of the first nanowire structure is disposed within the second region.

3. The method of claim 1, wherein a source/drain (S/D) region of the first nanowire structure is disposed within the first region, and a gate region of the first nanowire structure is disposed within the second region.

4. The method of claim 1, wherein the epitaxial layer comprises a silicon germanium layer.

5. The method of claim 1, further comprising forming a second nanowire structure on the substrate, wherein the second nanowire structure comprises a gate region and at least one S/D region.

6. The method of claim 5, wherein the diameter of the second nanowire structure within its gate region is different from the diameter of the first nanowire structure within its gate region.

7. The method of claim 5 wherein the diameter of the second nanowire structure within its S/D region is different from the diameter of the first nanowire structure within its S/D region.

8. The method of claim 5, wherein the method for forming the second nanowire structure comprising:

forming a second nano channel structure on the substrate;

forming an oxide layer to cover the first nano channel structure, but not covering the second nano channel structure; and performing an anneal process, to transform the second nano channel structure into the second nanowire structure.

* * * * *